United States Patent [19]
Yoshitake et al.

[11] Patent Number: 6,090,176
[45] Date of Patent: Jul. 18, 2000

[54] SAMPLE TRANSFERRING METHOD AND SAMPLE TRANSFER SUPPORTING APPARATUS

[75] Inventors: Shusuke Yoshitake, Kanagawa-ken; Yoshiaki Tsukumo, Tokyo; Ryoichi Hirano; Toru Tojo, both of Kanagawa-ken; Yoshiaki Tada, Shizuoka-ken; Makoto Kanda, Kumamoto-ken, all of Japan

[73] Assignee: Kabushiki Kaisha Toshiba, Kawasaki, Japan

[21] Appl. No.: 09/038,037

[22] Filed: Mar. 11, 1998

[30] Foreign Application Priority Data

Mar. 18, 1997 [JP] Japan ................... 9-064472
Jul. 31, 1997 [JP] Japan ................... 9-205834

[51] Int. Cl.[7] ................................................. B65D 85/90
[52] U.S. Cl. ..................... 55/385.4; 118/719; 414/220; 438/949
[58] Field of Search .................... 118/50.1, 719, 118/723 EB, 723 FE; 55/356, 385.2, 385.4; 414/220, 221; 430/5; 438/908, 949; 454/187

[56] References Cited

U.S. PATENT DOCUMENTS

| | | | |
|---|---|---|---|
| 4,503,807 | 3/1985 | Nakayama et al. | 118/719 |
| 4,666,479 | 5/1987 | Shoji | 55/385.4 |
| 4,739,882 | 4/1988 | Parikh et al. . | |
| 4,851,018 | 7/1989 | Lazzari et al. | 55/385.2 |
| 4,995,430 | 2/1991 | Bonora et al. . | |
| 5,169,272 | 12/1992 | Bonora et al. . | |
| 5,277,654 | 1/1994 | Fenn et al. | 55/356 |
| 5,364,219 | 11/1994 | Takahashi et al. | 118/719 |
| 5,833,726 | 11/1998 | Kinkead et al. | 55/385.2 |
| 5,843,196 | 12/1998 | Leavey et al. | 55/385.2 |
| 5,855,679 | 1/1999 | Ogawa | 118/719 |
| 5,873,468 | 2/1999 | Ejima et al. | 55/385.4 |

OTHER PUBLICATIONS

Robert M. Genco, et al., "Control Microcontaminants with Wafer Cassette Purging," Semiconductor International, (Apr. 1997), pp. 91–93.

Ruth DeJule, "1000 mm/sec Reticle Stage Design," Semiconductor International, (Apr. 1997), p. 36.

*Primary Examiner*—C. Scott Bushey
*Attorney, Agent, or Firm*—Oblon, Spivak, McClelland, Maier & Neustadt, P.C.

[57] ABSTRACT

A method of transferring a sample to and from a treating chamber kept in a vacuum atmosphere through a pressure regulative preparatory chamber. The sample is contained in the sample transfer container, which is kept air-permeable by a dust filtering filter, in a cleaned atmosphere before the sample is transferred to the treating chamber. The sample transfer container is transferred into the preparatory chamber, and the inside of the preparatory chamber is evacuated to a vacuum atmosphere. The sample is then extracted from the sample transfer container in the vacuum atmosphere and is transferred into the treating chamber. Also disclosed is an apparatus for supporting the sample transferring method.

7 Claims, 7 Drawing Sheets

SAMPLE TRANSFERRING METHOD AND SAMPLE TRANSFER SUPPORTING APPARATUS

BACKGROUND OF THE INVENTION

1. Field of the Invention

The present invention relates to a method of transferring a sample to and from a treating chamber such as a charged beam drawing apparatus kept in a vacuum atmosphere through a pressure-regulative preparatory chamber, an apparatus for supporting the practice of the sample transferring method, a charged beam drawing apparatus and a charged beam drawing method.

2. Related Art

In the process for manufacturing a semiconductor device, as well known in the art, there is employed the lithography technique by which a mask pattern drawn on a mask made of quartz is transferred to a wafer. For forming the mask pattern on the mask, there is generally employed a charged beam drawing apparatus. In this charged beam drawing apparatus, an electron beam, as emitted from an electron gun as the charged beam, is shaped and reduced to a desired shape, so that this shaped electron beam is repeatedly deflected and irradiated according to pattern data to form the pattern on the mask.

In recent years, the high degree of integration of the semiconductor device has progressed so rapidly that the mask pattern to be used in the lithography has become finer and finer. As the pattern size is thus reduced to dense the pattern, there increases the pattern data necessary for forming the mask pattern. This raises a tendency to deteriorate the throughput of the charged beam drawing apparatus. In order to prevent this deterioration in the throughput, it is conceivable to improve the performance of the charged beam drawing apparatus, but this improvement is not easy in the least. In this place, therefore, endeavors have been devoted to an improvement in the production yield of masks. This is the concept of retaining the throughput of the entire mask production system by increasing the conforming masks having less pattern defects.

The defects of mask patterns are frequently caused by the sticking of particles despite of various causes. When a mask is to be drawn by the charged beam drawing apparatus, more specifically, the particle or the like will form an unexposed portion to cause the pattern defect if it shields the charged beam at such a portion of a mask substrate having an applied photosensitive resist as to be exposed. Here, it has been performed to correct the formed pattern on the basis of the information which is acquired by locating the defects and by examining the number of defects by means of a defect inspection system. For many pattern defects, however, it takes a long time to correct the defects and to inspect them again. Thus, such defective devices are disposed.

In order to improve the production yield of masks effectively, therefore, it is necessary to establish a technique or method to keep the portion to be exposed away from the particle such as dust for the time period from the application of the photosensitive resist to the mask substrate to the drawing action with the charged beam.

The particle can be exemplified by the dust floating in the air, an organic substance such as the skin of an operator handling the mask, or metal powder to come from the sliding portions of the apparatus.

In the mask production site of the prior art, therefore, the degree of cleanness of the clean room, in which the mask manufacturing apparatus is installed, is improved from the class 100 (100 particles of 0.3 $\mu$m per cubic meters) to the class 10 (10 particles of 0.3 $\mu$m per cubic meters). On the other hand, the mask having an applied photosensitive resist is tested by an atmospheric dust tester to confirm that no particle is on the mask surface. Before the mask is set in the drawing apparatus, moreover, a visual inspection test is performed to confirm the absence of an atmospheric dust by irradiating the mask drawing surface with an oblique illumination.

In recent years, there has been desired the appearance of a semiconductor device matching 1G (giga) DRAM. In this device having an extremely high degree of integration, the width of the pattern to be drawn on the wafer is 0.15 $\mu$m or less. At the actual transfer of the mask pattern to the wafer, moreover, there is adopted a method of transferring the mask pattern by reducing it to one quarter. It is, therefore, anticipated that the size of the necessary mask pattern is 0.6 $\mu$m or less.

When the pattern of such size is to be drawn on the mask, an environment for a clean room having a degree of cleanness of the class 10 (10 dusts of 0.3 $\mu$m per cubic meters) is insufficient, and the clean room has to have a cleanness from the class 1 (1 particles of 0.3 $\mu$m per cubic meters) to the class 0.1 (0.1 dusts of 0.3 $\mu$m per cubic meters).

However, the realization of such environment for the entire clean room is accompanied by technical and economic difficulties. It is, therefore, conceivable to eliminate the technical and economic difficulties not by improving the entire cleanness of the clean room but by keeping only the minimum target environment clean. By using an atmospheric dust tester of higher sensitivity and accuracy, moreover, the works of the visual inspection tests requiring the manpower can be eliminated to reduce the possibility for the atmospheric dust to stick to the mask.

However, the charged beam drawing apparatus such as an electron beam drawing apparatus for masks or a direct electron beam drawing apparatus is equipped with a preparatory chamber, in which the vacuum and the atmosphere are repeated, so as to draw a pattern on the mask in the vacuum atmosphere. In order to eliminate the vibrations coming from the outside, moreover, the charged beam drawing apparatus is isolated from the building by a vibration proofing device. This makes it difficult to locally clean the space between the preparatory chamber and the outside mask transfer apparatus, and the atmospheric dust may stick to the drawing face of the mask having the applied photosensitive resist while the mask is being transferred from the outside mask transfer apparatus to the preparatory chamber. Moreover, the atmospheric dust may migrate during the transfer of the mask to the preparatory chamber and may float during the evacuation of the preparatory chamber and stick to the drawing face of the mask.

Against the contamination of the particle sticking to the surface of the sample, as well known in the art, remarkable considerations have been taken in the prior art. However, the allowable size of particle grows smaller and smaller for the narrower circuit lines so that the contamination cannot be avoided by the conventional system or by the cares of the operator.

As described hereinbefore, a mask of high quality is indispensable for realizing the semiconductor device corresponding to 1G DRAM. For this high quality, the mask has to be handled in a cleaner atmosphere. In this case, it is desirable not to improve the degree of cleanness of the entire clean room but to adopt the so-called "local cleaning method" by which only the minimum environment, as required, is kept clean. Since the charged beam drawing apparatus to be used for drawing the pattern on the mask is equipped with the preparatory chamber repeating the vacuum and the atmosphere, however, there arises the problem that it is difficult to locally clean the space between the preparatory chamber and the mask supply/recovery device.

SUMMARY OF THE INVENTION

It is, therefore, an object of the invention to provide a sample transferring method and a sample transfer supporting apparatus capable of contributing to a realization of a local cleaning of a system for manufacturing a mask, which can be transferred to a treating chamber kept in a vacuum atmosphere through a pressure regulative preparatory chamber and which is used in a process for manufacturing a semiconductor device, for example.

The invention has been conceived to solve the above-specified problems and has another object to provide a charged beam drawing apparatus and method capable of protecting the sample against the contamination with particle.

In order to achieve the above-specified objects, according to the invention, there is provided a method of transferring a sample to and from a treating chamber kept in a vacuum atmosphere through a pressure regulatively preparatory chamber, comprising: the step of containing the sample in the sample transfer container, which is kept air-permeable by a dust filtering filter, in a cleaned atmosphere before the sample is transferred to the treating chamber; the step of transferring the sample transfer container into the preparatory chamber and evacuating the inside of the preparatory chamber to a vacuum atmosphere; and the step of extracting the sample from the sample transfer container in the vacuum atmosphere and transferring the sample into the treating chamber.

In order to achieve the aforementioned objects, moreover, there is provided an apparatus for supporting the transfers of a sample to and from a treating chamber kept in a vacuum atmosphere through a pressure regulatively preparatory chamber, comprising: a sample transfer container kept air-permeable by a dust clearing filter; means for containing the sample in the sample transfer container in a cleaned atmosphere; and means for transferring either the sample transfer container containing the sample by the first-named means or the sample transfer container containing the sample in the preparatory chamber to or from the preparatory chamber.

Here, the filter of the sample transfer container is preferred to be removably mounted in a container body.

Moreover, the treating chamber may be a drawing chamber in a charged beam drawing apparatus, and the sample may be a mask to be drawn with a pattern by the drawing apparatus.

In the sample transferring method according to the invention and the apparatus for supporting the practice of the method, the sample transfer container, as kept air-permeable by a particle cleaning filter, is employed when the sample is to be transferred. The sample transfer container having this structure can be evacuated through the filter or returned to the atmosphere while containing the sample therein. Even if the pressure in the container is changed, moreover, the inside of the container is protected by the filter so that no particle will migrate into the container from the outside.

In the sample transferring method according to the invention, the sample is contained in the sample transfer container having the above-specified characteristics in a cleaned atmosphere before the sample is transferred to the treating chamber. The sample transfer container is transferred into the preparatory chamber, and the inside of the preparatory chamber is evacuated to a vacuum atmosphere. The sample is then extracted from the sample transfer container in the vacuum atmosphere and is transferred into the treating chamber.

As a result, no trouble occurs even in the ordinary atmospheric space between the atmosphere, as kept clean for containing the sample in the sample transfer container, and the preparatory chamber. Moreover, when the sample transfer container containing the sample is contained in the preparatory chamber and when this preparatory chamber is evacuated to the vacuum atmosphere, the inside of the sample transfer container is also simultaneously evacuated to automatically establish the conditions under which the sample can be extracted by opening the sample transfer container. If, in this case, particle sticks to the outer face of the sample transfer container while this container is being transferred into the preparatory chamber, the sticking particle will migrate together with the container into the preparatory chamber. However, the condition for opening the sample transfer container in the preparatory chamber is that the preparatory chamber is kept in the vacuum atmosphere. In this vacuum atmosphere, even if the particle sticks to the outer face of the container, for example, there hardly occurs the phenomenon that the particle is flown up by the action of opening the container. As a result, the particle sticking to the outer face of the sample transfer container will not stick to the sample so that the system can be locally cleaned while preventing the particle or the like from sticking to the sample.

In order to achieve the above-specified objects, there is provided a charged beam drawing apparatus comprising: an openable container capable of containing the sample and having an air vent opened in its portion and kept air-permeable by a filter; and an opening/closing mechanism for opening/closing the container contained and arranged in the preparatory chamber while keeping the vacuum state in the preparatory chamber.

In a charged beam drawing method, the sample is placed, while being contained in an openable container having an air vent in its portion, in the preparatory chamber until the inside of the preparatory chamber takes a vacuum state. In other words, the gas in the preparatory chamber is evacuated while the sample is being contained in the container. By this characteristics, the sample can be reliably protected against the contamination that the dust to be flown up in the air might otherwise stick to the sample.

In a charged beam drawing method according to the invention, the sample is contained, before the start of the suction of the preparatory chamber, in an openable container having an air vent opened in its portion. In other words, the gas is sucked into the preparatory chamber while the sample is being contained in an openable container having an air vent opened in its portion. By these characteristics, the sample can be reliably protected against the contamination that the dust to be flown up in the air might otherwise stick to the sample.

A vacuum container according to the invention comprises: a sealed container capable of keeping its internal vacuum state; an openable container adapted to be arranged in the sealed container and having an air vent formed in its portion and fitting a cleaning filter therein for containing a sample; and a mechanism for opening/closing the sealed container while keeping it in the vacuum state. If the vacuum container having this construction is employed in the situation where the dust flown up in the sealed container may stick to the sample to raise the contamination, it is possible to achieve an effect to protect the sample reliably against such contamination.

In a method of transferring a sample to pass the environment accompanied by the contamination including the dust sticking to the sample surface, according to the invention, the sample is contained in the container in the environment accompanied by the contamination but is extracted from the container in the environment accompanied by no contamination. If the sample is transferred by this method, it is possible to achieve an effect that the sample can be reliably protected against the contamination.

DESCRIPTION OF THE PREFERRED EMBODIMENTS

An embodiment of the invention will be described with reference to the accompanying drawings.

Figure 1:
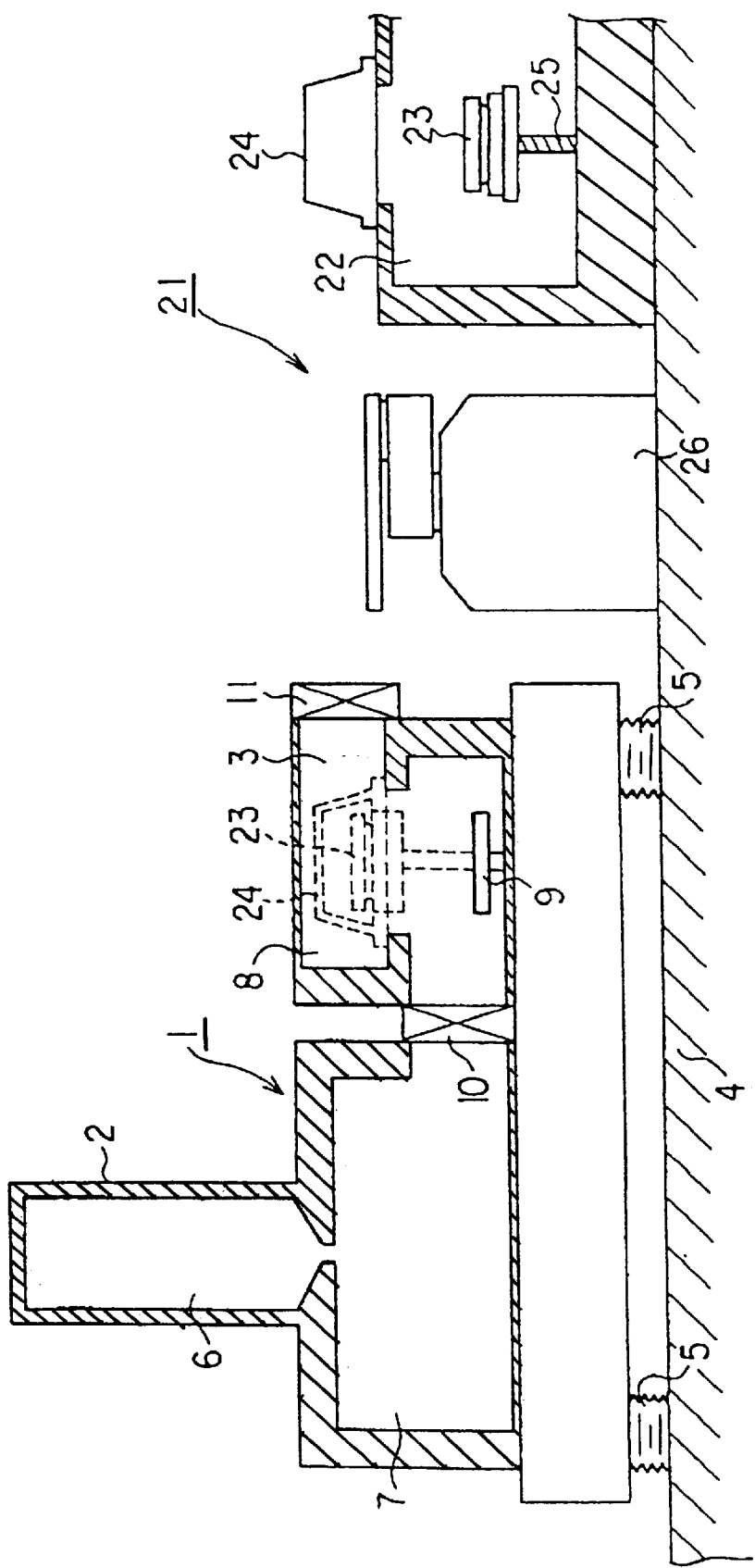
FIG. 1 is a conceptional diagram showing an embodiment in which a sample transfer method according to the invention is applied to transfers of a mask to and from a charged beam drawing apparatus.

FIG. 1 is a conceptional diagram showing a transfer supporting apparatus for executing a sample transfer method according to the invention, namely, an apparatus for supporting the transfer of a mask to and from a charged beam drawing apparatus.

In FIG. 1, reference numeral 1 designates the charged beam drawing apparatus. This charged beam drawing apparatus 1 is constructed to comprise: a drawing apparatus body 2; a preparatory chamber 3 attached to the drawing apparatus body 2 and employed for delivering a mask or sample to and from the drawing apparatus body 2; and a vibration proofing device 5 interposed between the charged beam drawing apparatus 1 and a floor 4 for isolating the entire apparatus from the external vibration source.

The drawing apparatus body 2 is equipped with: a charged beam control chamber 6 for generating an electron beam in a vacuum atmosphere and shaping/deflecting the electron beam; and a drawing chamber 7 acting as a treating chamber for exposing the mask or sample, while holding it, with the charged beam which is emitted from the charged beam control chamber 6.

The preparatory chamber 3 is equipped with: a space 8 in which a later-described sample transfer container 24 is disposed; an opening/closing mechanism 9 for opening/closing the sample transfer container 24; a gate valve 10 disposed at the boundary of the drawing chamber 7 for keeping it always in the vacuum atmosphere; and a gate valve 11 disposed at the boundary of the atmosphere and employed for transferring the mask, i.e., the sample transfer container 24. The pressure in the preparatory chamber 3 is selectively controlled to the vacuum atmosphere at a level similar to that of the drawing chamber 7 and the atmospheric level by a not-shown pressure controller.

On the other hand, reference numeral 21 designates a sample transfer supporting apparatus. This transfer supporting apparatus 21 is constructed to comprise: a local clean space unit 22 having a flow of clean air of about class 0.1; an elevating mechanism 25 disposed in the local clean space unit 22 for exchanging a mask 23 or sample in the sample transfer container 24; and a transfer robot 26 for transferring the sample transfer container 24 containing the mask 23 into the preparatory chamber 3 through the gate valve 11 and the sample transfer container 24 from the preparatory chamber 3 to the outside through the gate valve 11.

Figure 2:
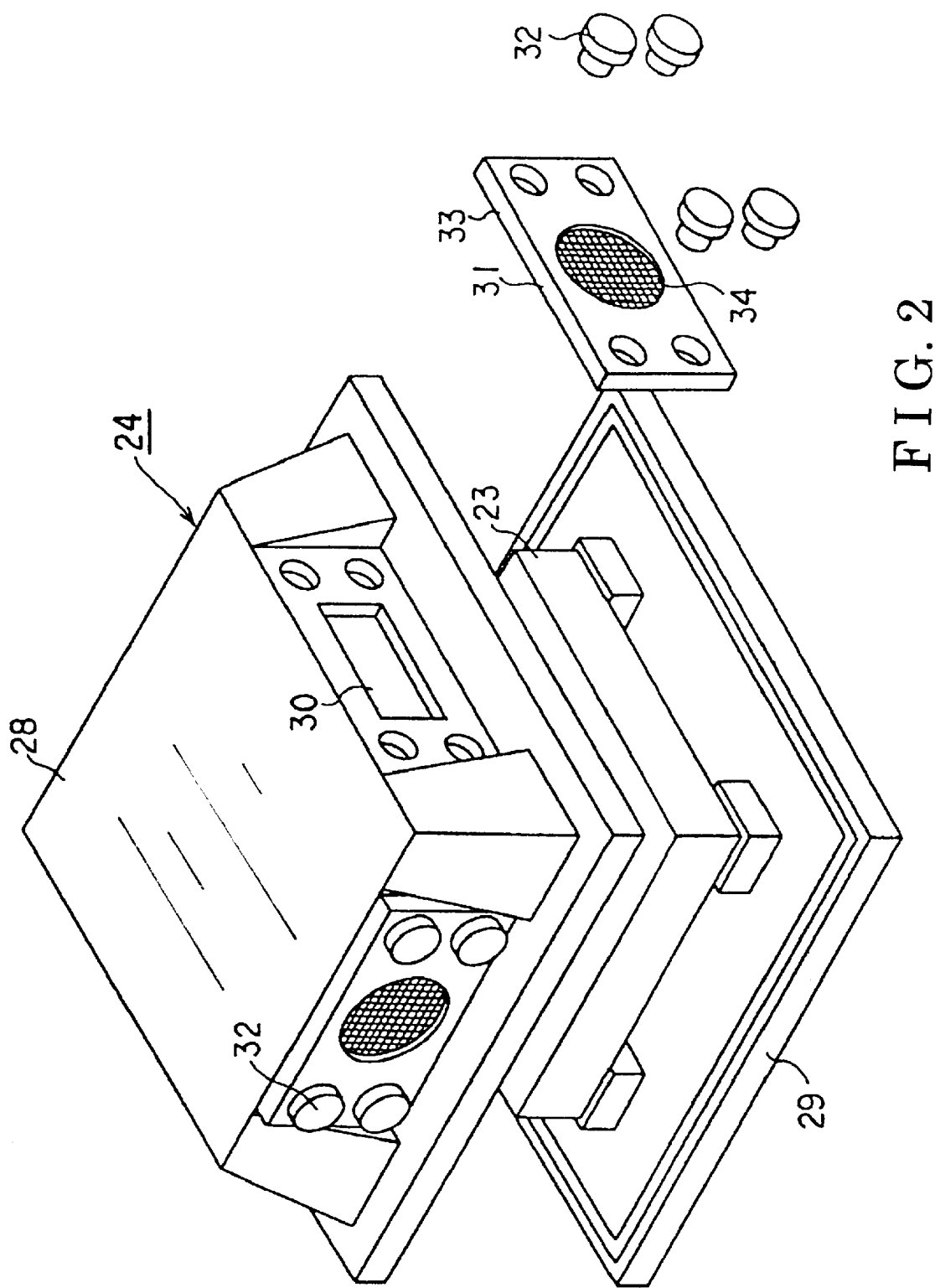
FIG. 2 is an exploded perspective view showing a sample transfer container to be employed for practicing the transfer method.

The sample transfer container 24 is equipped, as shown in FIG. 2, with: a container body 28 having an opening directed downward; and an undercover member 29 for closing the opening of the container body 28 selectively. In the joint portion between the container body 28 and the undercover member 29, there is sandwiched a not-shown O-ring seal or gasket which is made of a resin or silicone rubber for retaining the air permeability. In the four side walls of the container body 28, as shown in FIG. 2, there are formed apertures 30 which are closed by filter units 31. These filter units 31 are removably fixed by screws 32. Each filter unit 31 is composed of a fixing jig 33 and an air filter 34 supported by the fixing jig 33 and having functions to filter out atmospheric dust of 0.1 $\mu$m or more and to retain the air permeability. The screws 32 may be replaced by a structure in which the filter unit 31 is fixed on the container body 28 by the pushing force of a spring.

Here will be described an example of the actions of the transfer supporting apparatus 21 thus constructed.

First of all, the following actions are performed, when the mask 23 coated with a photosensitive resist is to be transferred into the preparatory chamber 3.

The mask 23 is coated with the photosensitive resist in the local clean space unit 22 having the flow of clean air of about class 0.1. The mask 23 coated with the photosensitive resist is introduced in the local clean space unit 22 into the sample transfer container 24. Then, the openings of the container body 28 in the sample transfer container 24 are covered gas-tight with the undercover member 29. These actions are performed by the elevating mechanism 25.

Next, the sample transfer container 24 containing the mask 23 is transferred close to the preparatory chamber 3 by the transfer robot 26. At this time, the gate valve 11 of the preparatory chamber 3 is opened so that the preparatory chamber 3 takes the atmospheric pressure. The transfer robot 26 transfers the sample transfer container 24 containing the mask 23 into the space 8 of the preparatory chamber 3.

When the sample transfer container 24 is placed in the preparatory chamber 3, the gate valve 11 at the atmospheric side is closed to start the evacuation of the air in the preparatory chamber 3. Since the air permeability in the sample transfer container 24 is retained by the filter units 31, the air in the sample transfer container 24 is also evacuated. At this time, no atmospheric dust in the preparatory chamber 3 will migrate into the sample transfer container 24. When the preparatory chamber 3 is evacuated, the atmospheric dust will not float so that it will not stick to the mask 23 even when the sample transfer container 24 is opened.

The mask 23 thus extracted is delivered to the drawing chamber 7 through the gate valve 10. This gate valve 10 is then closed so that a pattern is drawn on the mask 23 with the charged beam in the drawing chamber 7. After this drawing action, the mask 23 is transferred in the procedure reversed from the foregoing one and is contained in the sample transfer container 24 so that it is delivered to the outside from the preparatory chamber 3 and further to developing and etching steps.

As seen from the actions thus far described, the mask 23 is transferred in this embodiment while being contained in the sample transfer container 24 which is kept air permeable by the filter units 31, so that the local clean space unit 22 can be employed. Since there is no necessity for fearing the floating of the atmospheric dust at the evacuation and at the atmospheric restoration in the preparatory chamber 3, moreover, these evacuation and atmospheric restoration need not be performed so slowly as to prevent the atmospheric dust from floating. This makes it possible to evacuate the preparatory chamber 3 for a shorter time period than that of the prior art.

Figure 3:
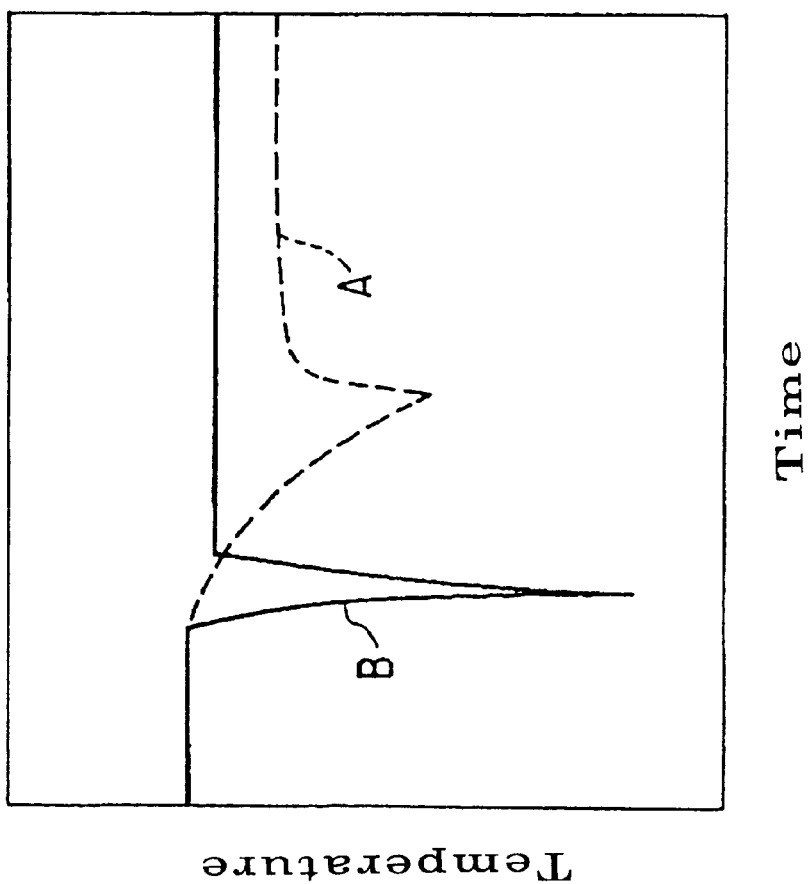
FIG. 3 is a diagram illustrating a relation between the evacuation rate of a preparatory chamber and the temperature change of a sample in comparison with that of the prior art.

As seen from FIG. 3 illustrating the mask temperature change (as plotted by a broken curve A) of the case in which the preparatory chamber 3 is evacuated by the conventional method and the mask temperature change (as plotted by a solid curve B) of the case in which the preparatory chamber 3 is evacuated by the method of the embodiment, the time period of the embodiment, for which the temperature of the mask 23 changes with the adiabatic expansion, can be shortened to reduce the range of the temperature drop of the mask 23.

Here, when static electricity may be established on the mask surface to attract the atmospheric dust by the flow of air at the time of restoring or evacuating the air in the preparatory chamber 3, this attraction of the atmospheric dust can be prevented by equipping the preparatory chamber 3 with a destaticizer or the like for emitting such a soft X-ray as can eliminating the static electricity without any contact, and by destaticizing the sample transfer container 24 after evacuated and opened. Moreover, the sample transfer method, as shown in FIGS. 1 and 2, should not be limited to the charged beam drawing apparatus but can be applied generally to all the systems that require the transfers of the sample to and from the treating chamber, which is kept in the vacuum atmosphere, through the pressure-adjustable preparatory chamber.

Figure 4:
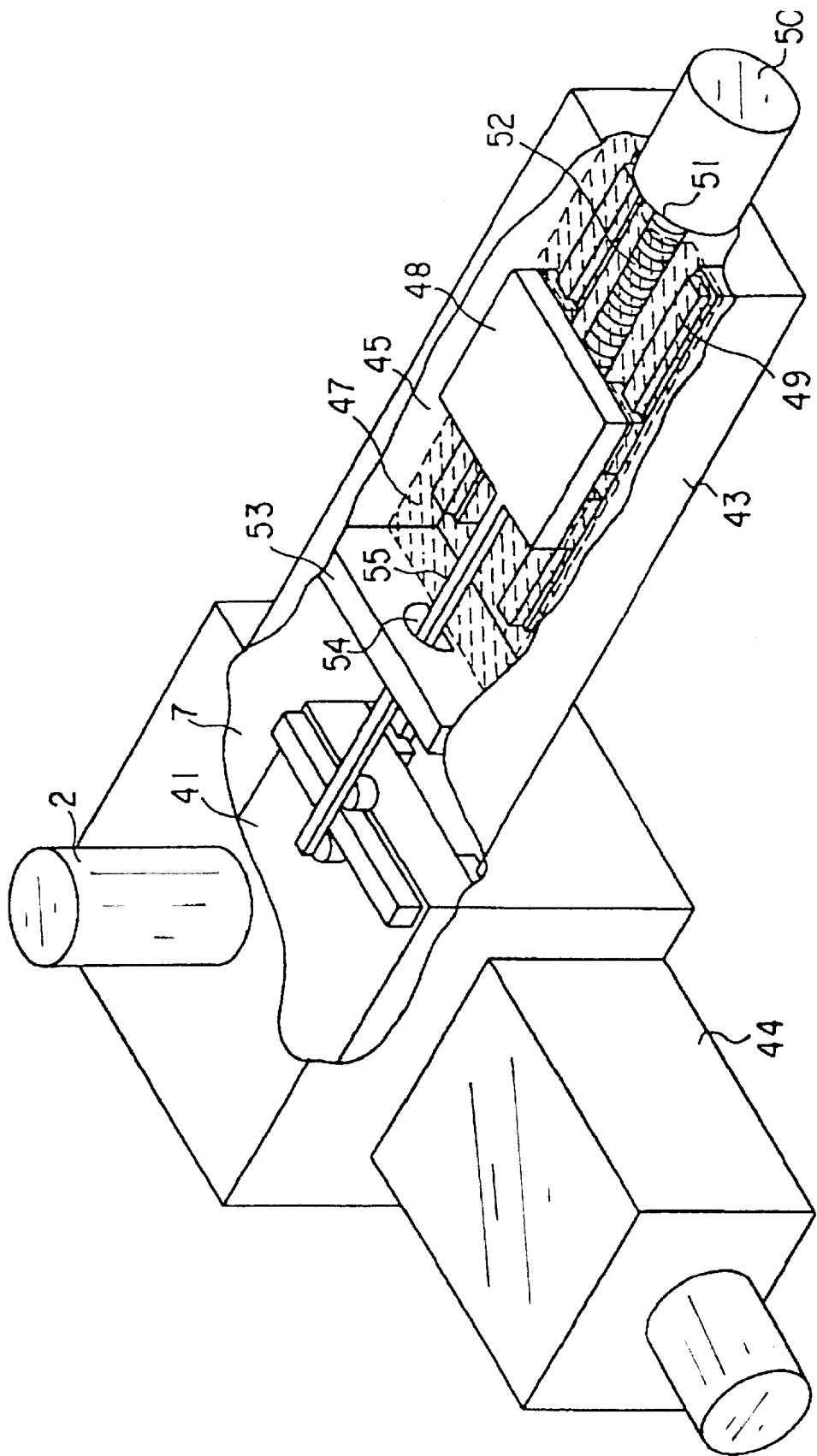
FIG. 4 is a diagram for explaining an improved drive system of an X-Y stage to be mounted in a drawing chamber.

FIG. 4 shows an example of the construction of a stage drive mechanism for moving the mask in the X and Y directions within the drawing chamber 7 described hereinbefore.

More specifically, the drawing chamber 7 is equipped therein with the stage drive mechanism for moving the mask in the X and Y directions. It is necessary to prevent the dust, if raised from the sliding portion of the stage drive mechanism, from sticking to the drawing region of the mask.

In order to suppress the scatter of dust, as raised from the sliding portion of a drive transmission unit or guide mechanism acting in the vacuum atmosphere, from being scattered, there has been proposed in the prior art a method of applying a lubricant to the sliding portion. This lubricant is exemplified by the Phonebrine Oil of Augemont Ltd., which has a vapor pressure as low as $5 \times 10^{-13}$ Torr or less at 20° C. for a grade as high as can be used as a lubricant seal for an ultra-high vacuum.

In the prior art, therefore, the oil of such a low vapor pressure is thinly applied to the sliding portion of the drive transmission unit or guide mechanism thereby to form a thin lubricant film thereby to improve the lubrication. Since the lubricant film to be formed has a thickness as thin as several molecules and since the oil to be consumed by the evaporation is not zero, however, it may lose the lubricating effect partially as the time elapses. Thus, this loss is compensated by applying the oil at every time periods that are empirically determined.

When the lubricating oil is periodically supplied, however, the dust may be raised from the portion where the lubricating layer is lost, if the interval of applying the oil is excessively elongated. If the oil is prematurely applied, on the other hand, the total amount of lubricant added to the mechanical portion may be so excessive as to scatter into the drawing chamber in accordance with the action of the mechanical portion.

Thus, according to the method using the lubricating oil, the excess oil may scatter to the individual portions in the drawing chamber and may be difficult to apply. In recent years, therefore, there has appeared a drive transmission unit or guide mechanism which is freed of maintenances by plating, vapor-depositing or sputtering the components of the sliding portions with a solid lubricating film of gold, silver, lead or MoS2. However, this drive transmission unit or guide mechanism utilizing the solid lubricating film is accompanied by a problem in the practical use because the lubricating film has a weak adhesion and an extremely short lifetime.

This problem is solved by the stage drive mechanism shown in FIG. 4.

In FIG. 4, the reference numeral 2 designates the charged beam control chamber which has been described in the foregoing embodiment, and the numeral 7 designates the drawing chamber which has also been described in the foregoing embodiment.

In this drawing chamber 7, there is arranged an X-Y stage 41 for holding the mask. Around and adjacent to the drawing chamber 7, there are provided lubricant sumps 43 and 44 in which drive mechanisms 45 and 46 (although the drive mechanism 46 is not shown) are so mounted for driving the X-Y stage 41 independently of each other that they are immersed in lubricating oil 47 of a low vapor pressure.

Each of the drive mechanisms 45 and 46 is constructed to include: an LM guide 49 for restricting the moving direction of a stage 48; a drive source such as a motor 50 acting in the atmosphere; a vacuum seal such as a magnetic fluid seal 51 for transmitting the rotational torque from the motor 50 to the vacuum; a feed screw such as a worm shaft 52 for transforming the rotational torque, as transmitted through the magnetic fluid seal 51, into a linear drive force thereby to transmit the drive force to the stage 48; and a transmission mechanism 55 for transmitting the motion of the stage 48 to the X-Y stage 41 through a narrow passage 54 which is formed over the liquid surface of the lubricating oil 47 and in a boundary wall 53 interposed between the lubricating oil 47 and the drawing chamber 7.

With this construction in which the sliding portions of the drive mechanisms 45 and 46 are always immersed in the lubricating oil 47 of a low vapor pressure, their lubrications are always kept excellent so that the rise of dust from the sliding portions can be prevented for a long time. Since the sliding portions are wholly immersed in the lubricating oil 47, moreover, the excess of this oil can be prevented from being scattered into the vacuum atmosphere by the actions of the sliding portions. Thus, it is possible to prevent the mask defect which might otherwise be caused by the drive system for driving the X-Y stage.

Figure 5:
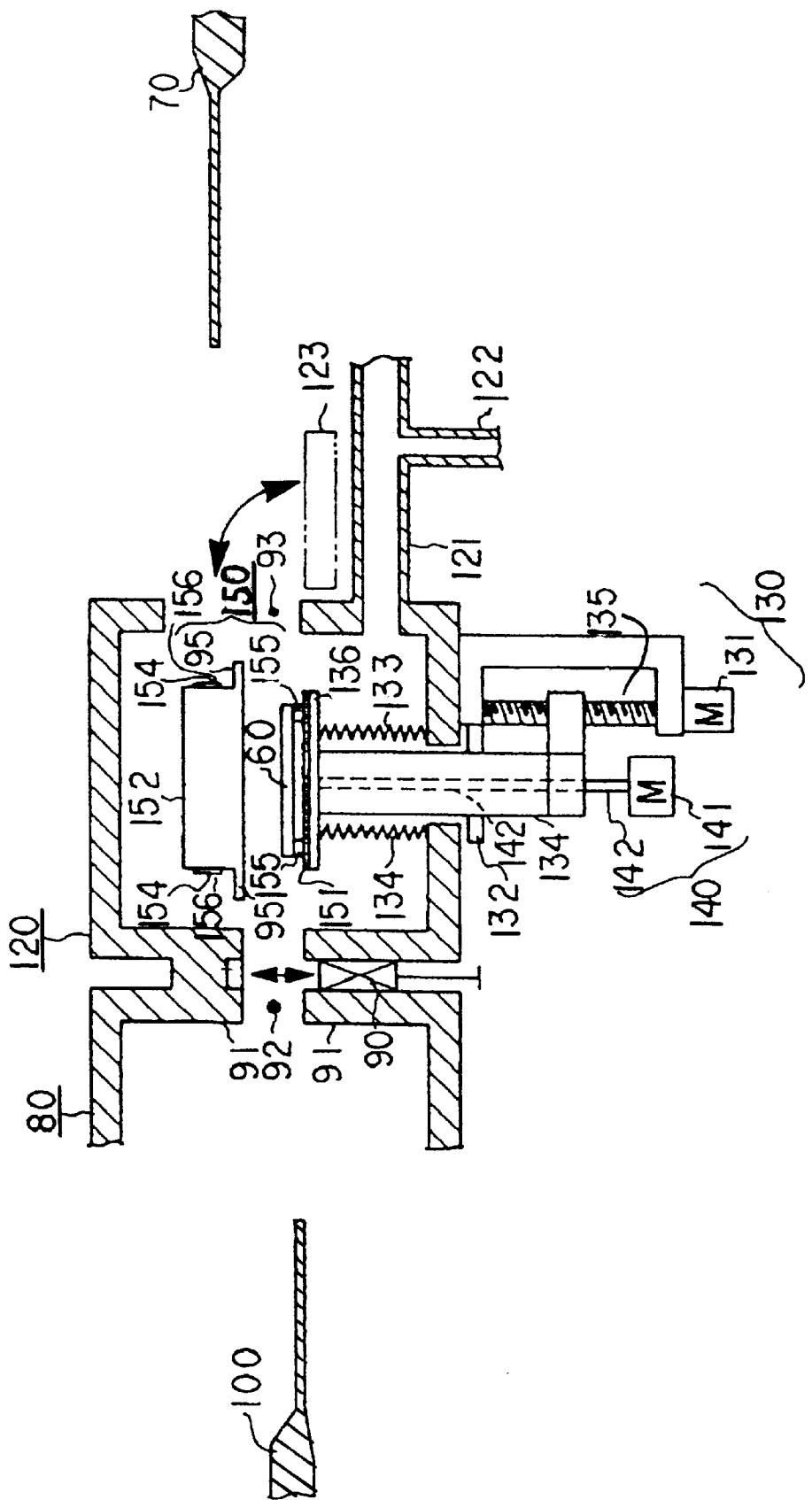
FIG. 5 is a section schematically showing a structure of an essential portion of a charged beam drawing apparatus according to another embodiment of the invention.

FIG. 5 is a section showing an essential portion of a charged beam drawing apparatus according to another embodiment of the invention for explaining the method of using a clean filter pod 150 acting as the sample transfer container in the preparatory chamber. A working chamber 80 is a sealed container which can be sealed up to keep the vacuum state, although not shown. In this working chamber 80, there is housing a member which is required directly for the drawing works using the charged beam, such as a working table for placing an electron gun, a focusing coil, a deflection coil, aperture or a sample 160 such as a quartz plate. Although not shown, the working chamber 80 is equipped therein with facilities for injecting a suitable gas into the chamber 80, a vacuum pump for evacuating the gas to establish a vacuum state in the chamber 80, and intake facilities for releasing the vacuum state.

To this working chamber 80, there is juxtaposed across a partition 91 a preparatory chamber 120 acting as a sealed container which has a smaller capacity than that of the chamber 80 and which is so sealed up as can be kept in the vacuum state as in the working chamber 80. In the central portion of this partition 91, there is opened a passage 92 which is made sufficiently wide for passing the sample 60.

This passage 92 is equipped with a valve 90 which can be opened to allow a robot arm 100 to transfer the sample 60 in the preparatory chamber 120 onto the working table in the working chamber 80. On the other hand, the valve 90 can be closed to keep the independence, the seal and the air permeability of the working chamber 80.

In the side wall of the preparatory chamber 120, there is opened a transfer port 93 for transferring the clean filter pod 150 containing the sample 60 to the inside from the outside of the preparatory chamber 120 and vice versa by a robot arm 70. The seal and air permeability of the inside of the preparatory chamber 120 can be kept by closing the transfer port 93 with a cover 123. Here will be described later the detail of the clean filter pod 150.

To the side wall of the preparatory chamber 120, on the other hand, there is connected a suction/evacuation main pipe 121 leading to a vacuum pump, although not shown, for evacuating the gas in the preparatory chamber 120 to establish a vacuum state therein. This suction/evacuation main pipe 121 is branched at its midway into a suction branch 122 leading to a suction valve and a cleaning filter, although not shown. By opening this suction valve, the gas can be fed through the cleaning filter, the suction branch 122 and the suction/evacuation main pipe 121 to the inside of the preparatory chamber 120 to release the inside of the preparatory chamber 120 freely from the vacuum state.

In the preparatory chamber 120, moreover, there is disposed a pod table 136 for placing hereon the clean filter pod 150 transferred by the robot arm 170. The pod table 136 can be freely moved up and down in the preparatory chamber 120 by a lift mechanism 130. This lift mechanism 130 is composed, as shown, of: a motor 131 for exhibiting a lifting force; a worm shaft 135 jointed to the drive shaft of the motor 131; and a lift shaft 134 so slidably fitted in a bearing 132 opened in the bottom slab of the preparatory chamber 120 as is slid up and down according to the rotation of the worm shaft 135, for example. The pod table 136 is fixed on the leading end of the lift shaft 134. In order to retain the seal of the preparatory chamber 120 without blocking the vertical movement of the pod table 136, moreover, the bottom slab of the preparatory chamber 120 and the pod table 136 are connected through a (vacuum) bellows 133.

Figure 6:
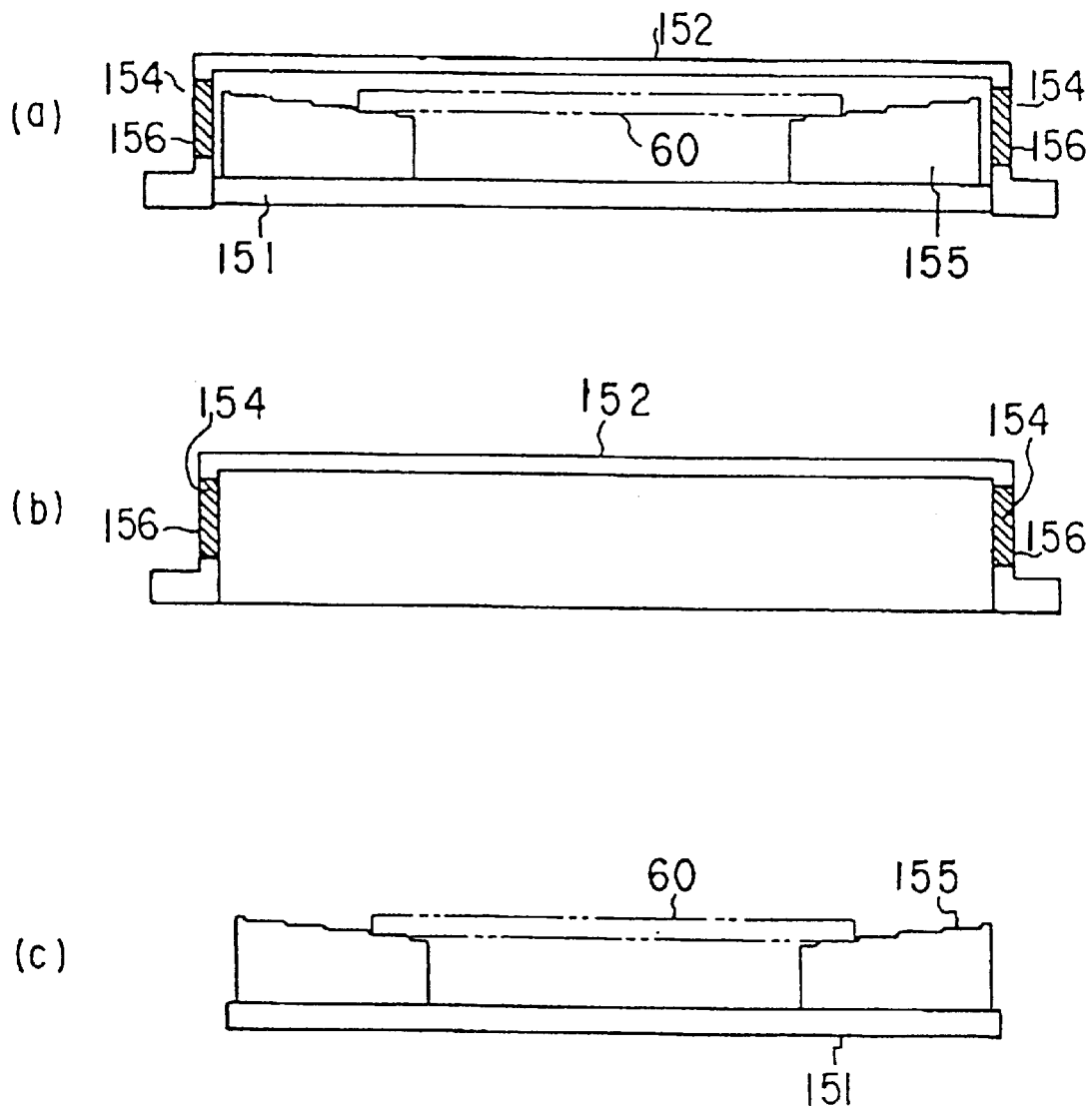
FIGS. 6A to 6C are diagrams showing a structure of a clean filter pod of FIG. 5.

The clean filter pod 150 is an openable small container for containing the sample 60 therein, as constructed in FIGS. 6A to 6C. FIG. 6A is a section showing the clean filter pod 150; FIG. 6B is a section showing a casing 152 of FIG. 6A; and FIG. 6C is a section showing the clean filter pod 150 without the casing 152 being opened. The clean filter pod 150 is composed of: a bottom plate 151; a sample table 155 fixed on the bottom plate 151; an openable casing 152 for covering the sample table 155 on the bottom plate 151 and the sample 60 to be placed on the former; an air vent 154 opened in the side wall of the casing 152; a cleaning filter 156 fitted in the air vent 154; a projection 95 projected from the side wall of the casing 152; and a lock mechanism for locking the casing 152 on the bottom plate 151.

Figure 7:
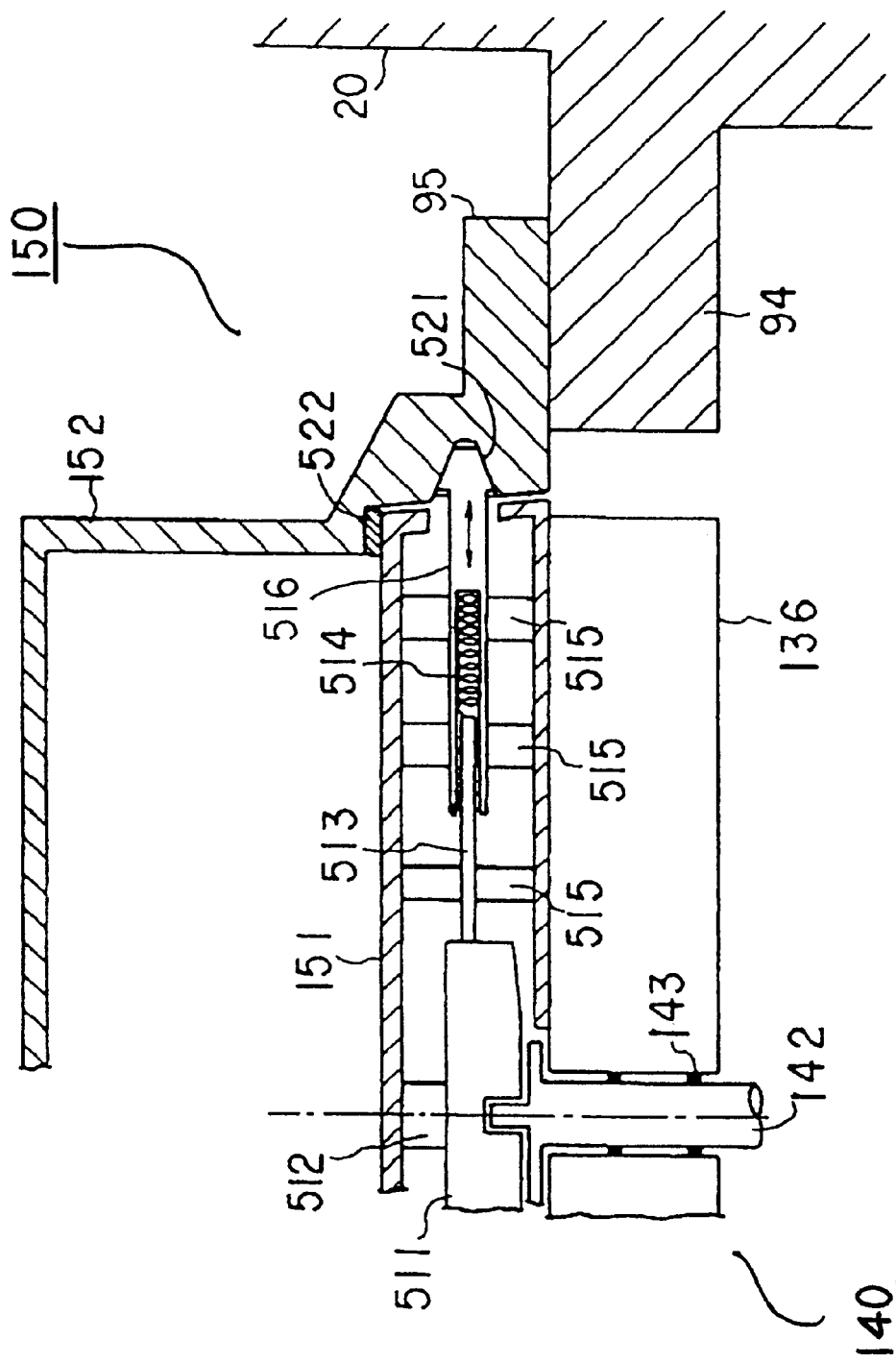
FIG. 7 is a section schematically showing structures of the clean filter pod of FIG. 5 and its unlock mechanism.

As the pod table 136 carrying the clean filter pod 150 is gradually descended from a higher steady position by the lift mechanism 130, the projection 95 comes to overlie a projection 94 projected horizontally from the inner wall of the preparatory chamber 120, as shown in FIG. 7. Even if the preparatory chamber 120 further moves down, the casing 152 is so retained by the projection 194 that it is kept away from descending any more. On the other hand, the bottom plate 151 leaves the casing 152 and descends together with the pod table 136. By these actions, the casing 152 of the clean filter pod 150 can be opened while keeping the preparatory chamber 120 in the sealed state (or in the vacuum state).

FIG. 7 is a section showing structures of a lock mechanism of the clean filter pod 150 and an unlock mechanism for releasing the locked state between the bottom plate 151 and the casing 152 by the lock mechanism. The locking state is achieved by fitting the leading end of a lock pin 516, which is slidably supported in the bottom plate 151 of the clean filter pod 150 by a bearing member 515, in a recess 521 which is formed in the casing 152. On the other hand, the release from this lock state is achieved by extracting the leading end of the lock pin 516 from the recess 521.

This extraction of the leading end of the lock pin 516 from the recess 521 can be performed while keeping the sealed state (or the vacuum state) of the preparatory chamber 120 as in the opening action of the casing 152. The structure for this unlocking action is made such that a rod 513 is connected to the back of the lock pin 516 through a coil spring 514 and such that the trailing end of the rod 513 is connected to a cam 511. When the casing 152 is in the lock state, the cam 511 takes the reference position. When the cam 511 is turned by a predetermined angle from the reference position, the lock pin 516 is retracted to release the lock state. For turning the cam 511, there is provided a motor 141. To the drive shaft of this motor 141, there is connected a rotary rod 142 extending through the inside of the lift shaft 143, so that the leading end of the rotary rod 142 is brought into engagement with the cam 511 when the pod 150 is placed on the pod table 136. Here, the clearance between the through hole of the pod table 136 and the rotary rod 142 is sealed by means of a vacuum seal 143 such as a Wilson seal so that the lock state can be released by turning the rotary rod 142 while keeping the preparatory chamber 120 in the sealed state (or the vacuum state).

Here will be described the actions of the present embodiment. The actions to be described are executed by a complete sequence control to be effected by a not-shown controller. First of all, the sample 60 is contained in the sufficiently cleaned clean filter pod 150, which is locked by covering it with the casing 152. The clean filter pod 150 thus containing the sample 160 is placed on the pod table 136 in the preparatory chamber 120 by the robot arm 70. At this time, the passage 92 is closed by the partition valve 90. After the clean filter pod 150 was placed on the pod table 136 in the preparatory chamber 120, the cover 123 of the preparatory chamber 120 is closed to seal the preparatory chamber 120. Then, the evacuation pump is started to evacuate the preparatory chamber 120, namely, to evacuate the internal gas of the preparatory chamber 120 to the outside. While the gas is being from the preparatory chamber 120, the gas in the clean filter pod 150 is also naturally evacuated from the air vent 154.

At this time, the fine dust will be flown to float in the preparatory chamber 120 by the turbulence of the internal gas. Since the sample 60 is contained in the clean filter pod 150, however, its surface can be protected from being contaminated by the dust or the like.

After a sufficient evacuation, moreover, the partition valve 90 is opened before the casing 152 of the clean filter pod 150 is opened to connect the preparatory chamber 120 having reached the vacuum state and the working chamber 80 having been kept in the vacuum state. When this valve 90 is opened, there arise relatively high vibrations. As a result, the fine dust may scatter in the preparatory chamber 120. Since the casing 152 of the clean filter pod 150 is closed till the partition valve 90 is opened out, however, the dust will not stick to the surface of the sample 60.

After the valve 90 was opened, the motor 141 of the unlock mechanism 140 is started to unlock the casing 152, and the lift mechanism 130 is started to move the pod table 136 downward. As a result, the casing 152 is separated from the bottom plate 151, as described hereinbefore, so that the clean filter pod 150 is opened.

Then, the transfer robot arm 100 is activated to scoop the sample 60 from the sample table 155 of the bottom plate 151 of the clean filter pod 150, and transfers it from the preparatory chamber 120 to the working chamber 80 and places it on the working table. After this, the sample transfer actions are ended by bringing the casing 152 and the bottom plate 151 of the clean filter pod 150 into engagement and by closing the valve 90. Then, the charged beam is generated from the electron gun so that a desired pattern is drawn on the sample 160 by focusing the charged beam while deflecting it suitably.

After the end of this drawing action, the sample 60 is delivered out in reversed procedure. Specifically, the valve 90 is opened at first to separate the casing 152 and the bottom plate 151 of the clean filter pod 150. Then, the transfer robot arm 100 is activated to scoop up the sample 60 from the working table of the working chamber 180 to the preparatory chamber 120 and to return it to the sample table 155 of the bottom plate 151 of the clean filter pod 150. Then, the lift mechanism 130 is activated to lift the pod table 136 and to cover the bottom plate with the casing 152 thereby to close the clean filter pod 150. The unlock mechanism 140 is started to bring the casing 152 into the lock state. Simultaneously with these actions, the valve 90 is closed.

After the valve 90 was closed, the casing 152 is closed before the suction valve is opened, to release the preparatory chamber 120 from the vacuum state.

At this time, the dust is flown up to float by the turbulence of the gas sucked vigorously but will not stick to the surface of the sample 60 because the casing 152 of the clean filter pod 150 is closed. Since the clearance between the bottom plate 151 and the casing 152 is sufficiently sealed up by a seal member 522, moreover, the gas also flows only through the air vent 154 into the clean filter pod 150. With the cleaning filter 156 fitted in the air vent 154, however, the dust is shielded and prevented from going into the clean filter pod 150.

After the vacuum state was completely released to the atmospheric level, the cover 123 of the preparatory chamber 120 is opened, and the clean filter pod 150 is delivered to the outside by the robot arm 70 with the casing 152 being closed. By repeating these serial actions, the sample 60 be substantially completely shielded from the particley environment.

As has been described hereinbefore, it is possible to completely eliminate the contamination that the dust might otherwise stick to the sample surface, as has raised problems in the evacuation or in the suction. Moreover, a more complete cleanness can be retained by opening/closing the clean filter pod 150 after the end of the situation in which vibrations are liable to occur as at the time of opening/closing the partition valve.

The invention should not be limited to the foregoing embodiments but can be practiced in various modifications. For example, the invention should not be limited to the aforementioned charged beam drawing apparatus but can be practiced in various modifications in various working apparatus using the vacuum or in the field where the contamination with the dust has to be prevented in the transfer procedure or before the working treatment of a sample even if no vacuum is used.

What is claimed is:

1. A method of transferring a sample to and from a treating chamber kept in a vacuum atmosphere through a pressure regulative preparatory chamber, comprising:

the step of containing the sample in the sample transfer container, which is kept air-permeable by a dust filtering filter, in a cleaned atmosphere before the sample is transferred to said treating chamber;

the step of transferring said sample transfer container into said preparatory chamber and evacuating the inside of said preparatory chamber to a vacuum atmosphere; and the step of extracting the sample from said sample transfer container in the vacuum atmosphere and transferring the sample into said treating chamber.

2. A method according to claim 1, comprising:

engaging said transfer container with said preparatory chamber to open said transfer container and expose said sample.

3. An apparatus for supporting the transfers of a sample to and from a treating chamber kept in a vacuum atmosphere through a pressure regulative preparatory chamber, comprising:

a sample transfer container kept air-permeable by a dust clearing filter;

containing means for containing the sample in said sample transfer container in a cleaned atmosphere; and transferring means for transferring said sample transfer container into or from said preparatory chamber wherein the inside of said preparatory chamber is evacuated to a vacuum atmosphere after said sample transfer container the sample is transferred to said preparatory chamber.

4. A sample transfer supporting apparatus according to claim 3, wherein the filter of said sample transfer container is detachably mounted in a container body.

5. A sample transfer supporting apparatus according to claim 3,
   wherein said treating chamber is a drawing chamber in a charged beam drawing apparatus, and
   wherein said sample is a mask to be drawn with a pattern by said drawing apparatus.

6. A sample transfer supporting apparatus according to claim 3, wherein:
   said transferring means further includes extracting means for extracting the sample from said sample transfer container in the vacuum atmosphere and transferring the sample into said treating chamber.

7. A sample transfer supporting apparatus according to claim 3, comprising:
   said transfer container having an upper portion and a lower portion; and
   said preparatory chamber having projections engaging with said upper portion of said transfer container to separate said upper and lower portions and expose said sample.

* * * * *